United States Patent [19]

Rychwalski et al.

[11] Patent Number: 5,178,956
[45] Date of Patent: Jan. 12, 1993

[54] PRETREATMENT PROCESS FOR ELECTROLESS PLATING OF POLYIMIDES

[75] Inventors: James Rychwalski, Medway; Paul J. Ciccolo, Ashland; Edward C. Couble, Brockton, all of Mass.

[73] Assignee: Shipley Company Inc., Newton, Mass.

[21] Appl. No.: 416,535

[22] Filed: Oct. 3, 1989

[51] Int. Cl.$^5$ .............................................. C23C 26/00
[52] U.S. Cl. .................................. 428/458; 427/304; 427/305; 427/306
[58] Field of Search ............... 427/304, 305, 438, 306; 428/458

[56] References Cited

U.S. PATENT DOCUMENTS

| | | | |
|---|---|---|---|
| 3,445,350 | 5/1969 | Klinger et al. | |
| 3,574,070 | 4/1971 | Sahely | |
| 3,668,130 | 6/1972 | Kadison | 156/642 |
| 3,689,303 | 9/1972 | Maguire et al. | |
| 3,881,049 | 4/1975 | Brandt | 427/306 |
| 3,959,531 | 5/1976 | Schneble | 427/304 |
| 3,963,590 | 6/1976 | Deyrup | |
| 4,042,729 | 8/1977 | Polichette | 427/306 |
| 4,063,004 | 12/1977 | Quinn | 427/304 |
| 4,515,829 | 5/1985 | Deckert | 427/306 |
| 4,552,626 | 11/1985 | Stevenson | |
| 4,552,787 | 11/1985 | Chebiniak | 427/305 |
| 4,594,311 | 6/1986 | Frisch et al. | |
| 4,775,449 | 10/1988 | Dumas et al. | |

FOREIGN PATENT DOCUMENTS

| | | | |
|---|---|---|---|
| 153875 | 12/1979 | Japan | 427/306 |
| 155681 | 8/1985 | Japan | 427/304 |

Primary Examiner—Shrive Beck
Assistant Examiner—Vi Duong Dang
Attorney, Agent, or Firm—Robert L. Goldberg

[57] ABSTRACT

A process for promoting the adhesion of metal to thermoplastic substrates such as polyimides. The improvement comprises conditioning the substrate by treating with a lactone and aqueous rinse prior to subsequent steps of etching and deposition of a metal coating. Use of the conditioner promotes increased adhesion between the substrate and the metal without loss of the cohesive integrity of the substrate throughout subsequent processing steps.

13 Claims, No Drawings

PRETREATMENT PROCESS FOR ELECTROLESS PLATING OF POLYIMIDES

BACKGROUND OF THE INVENTION

1. Introduction

This invention relates to an improved method of treating the surface of an organic polymer substrate prior to electroless deposition of a metal coating. The method is easy to use, represents a reduction in the number of pretreatment steps necessary prior to electroless deposition of a metal onto the substrate and provides improved adhesion between the substrate and metal deposit.

2. Discussion of Prior Art

Even though significant progress has been made in the art of plating metals on plastics, the adhesion between the coating and the plastic still leaves much to be desired. Poor adhesion between the plastic and the metal plate allows differential dimensional changes with temperature which may result in warping, blistering, and cracking of the metallized product. Consequently, strong adhesion between a plastic substrate and the plated metallic layer is essential for any application in which the product is subjected to significant temperature fluctuations.

Numerous methods are proposed in the prior art for depositing a metal coating over plastic. The method most commonly used involves steps including surface converting a plastic part with an oxidant such as a solution of alkaline permanganate or sulfuric acid containing a source of hexavalent chromium ions, deposition of a conductive, adherent metallic film by chemical reduction followed by electrodeposition of an intermediate layer, frequently copper, and finally a layer of a desired outer metal coating such as chromium, nickel, gold, solder, silver or zinc. Only moderate bond strength between a plastic substrate and metal coating is obtained by this method. Also relatively high temperatures are required for the surface converting step and careful control of the chromium ion concentration is necessary.

Plastics show a relatively poor affinity for metal and to promote a stronger bond between a plastic substrate and a metallic coating the prior art has frequently resorted to roughening the plastic surface to provide locking or keying between the surface and its coating. The surface of a molded plastic article normally is glossy and quite hydrophobic. Consequently, this surface is unreceptive to aqueous solutions used in electroless metal deposition. Since the sensitizing and activating solutions will not wet the surface, the metal ions are not adsorbed onto the surface and deposition of the metal cannot proceed.

Rendering the surface of the substrate hydrophilic by roughening has been common practice in plating plastic materials. Initially, this surface roughening was accomplished by some form of mechanical deglazing, such as scrubbing with an abrasive slurry, wet tumbling, dry rolling or abrasive (sand) blasting. These procedures generally lead to a composite having an adequate bond between substrate and coating, but due to relatively large visible irregularities on the plastic surface formed during the roughening operation, a thick metal coating must be applied to avoid surface defects and obtain a coating having a smooth, highly polished appearance. Mechanical deglazing of the surface has been found to be fairly effective, but is extremely costly in that many parts have to be finished by hand. Another disadvantage to mechanical etching is that it is hard to control and many problems are encountered when the surface abrasion is carried too far. Methods of mechanical roughening are not applicable to three-dimensional products or more particularly, printed circuit boards having through-holes. In any event, adhesion values above one pound per inch are only rarely obtainable.

Roughening has also been accomplished chemically using an acidic etch solution or a solvent for dissolving a portion of the plastic surface. Chemical deglazing or etching techniques usually require use of strong, acidic solutions such as sulfuric acid and chromate salts. The latter treatment was found to have the effect of activating bonding sites for subsequent electroless metal deposition. Chemical etching by an acid chromate oxidizing solution was then found to be more effective when the surface was pretreated with a strong caustic, such as sodium hydroxide, combined with immersion in a reducing solution containing hydrochloric acid after the etching.

Further improvements of bond adhesion included using a pretreatment emulsion as described in U.S. Pat. No. 3,574,070. The emulsion consisted of a non-solvent for the plastic and a solvent for the plastic which were emulsifiable.

U.S. Pat. No. 4,594,311 describes a process for restoring hydrophobicity to the exposed surface of an adhesion promoted resinous surface of a base material after a catalytic resistless image has been imposed thereon. The process involves exposure of the treated resinous surface to a solvent or solvent vapors in order to restore hydrophobicity to the surface.

Pretreatment of an ABS polymer substrate prior to electroless deposition of metal is described in a 1969 U.S. Pat. No. 3,445,350. The method relates to specific solvents which may be used with the specific ABS resins to achieve improved adhesion.

Further studies in the area of adhesion promotion of ABS resins, including platable grades, showed that even though bond strength was improved, organic pre-etching has been observed to have an adverse effect on surface appearance. It was observed that when an ABS resin is organically pre-etched there is incomplete drainage of the pre-etch solution from the articles when they are withdrawn from the tank. Such problems showed themselves as defects in the article surface after electroless plating.

Another attempt at improvement was made and disclosed in U.S. Pat. No. 3,689,303. This process for pretreatment added an additional step of contacting an ABS resin article with an oxidizing agent prior to the organic pre-etch step. The method involves an 8-10 step process for pretreating an ABS resinous substrate prior to electroless deposition of metal.

Another patent, U.S. Pat. No. 4,552,626 teaches a combined pretreatment step of deglazing and removal of filler by use of an acid bath for polyamides. This step is preferred over the use of an organic solvent bath to deglaze the substrate, which may result in gelling of the resin if the solvent is not dilute.

U.S. Pat. No. 3,963,590 describes a process for electroplating polyoxymethylene (polyacetal). The pretreatment process involves treatment with quinoline or gamma-butyrolactone prior to acid etching.

While such methods as described above increase adhesion, they are often not entirely satisfactory for several reasons. Such techniques are not always transferable to all substrates and particularly not to all grades of engineering thermoplastic substrates. Use of such techniques may result in degradation of the molecules forming the surface of the substrate, and may decrease both tensile and impact strength of the substrate due to swelling and cracking of the entire substrate material. Several of the prior art solvents used for organic pre-etching are also not suitable because they are known to remove significant amounts of the resin or resin filler, thus having a direct effect on the integrity of line and space dimensions of 15 the substrate during further processing.

U.S. Pat. No. 4,775,449 provides a process for improving adhesion of metal to a polyimide surface without physical modification or degradation of the surface structure. The process involves pretreatment of the polyimide surface with an adhesion promoting compound containing a nitrogen-oxygen moiety prior to plating.

An object of this invention is to provide an improved process for promoting the adhesion of metal to various engineering thermoplastic substrates without physical modification or degradation of the surface structure. The cohesive integrity of the surface of the substrate is maintained throughout subsequent processing steps. The method provides a means for increasing the adhesion of metallic traces to the surface while maintaining the ability of the surface to be patterned by various techniques.

SUMMARY OF THE INVENTION

The invention to be disclosed describes a pretreatment conditioner for use with various engineering thermoplastic resins prior to electroless deposition of metal. The process constitutes an improvement over the prior art since a significantly higher degree of adhesion can be achieved using a solvent system with little degradation or deformation of the substrate. More specifically, the invention relates to use of a specific conditioner for polyetherimide thermoplastics prior to oxidizing etchants, which pre-conditions the resin, greatly influencing the way that the etchant attacks the surface. This pretreatment allows the etch to create a maze of submicroscopic cavities or pores on the surface, which can act as interlocking sites for the autocatalytically deposited metal film. The nature of this surface plays a significant role in establishing adhesion without unduly weakening or adversely affecting the physical characteristics of the resin. The specific conditioner, which is a lactone, when employed under various process parameters, consistently produces adhesion values in the range of 8–16 lbs./linear inch depending on the grade of the substrate.

DESCRIPTION OF THE PREFERRED EMBODIMENTS

The substrate of the present invention may be in a variety of shapes and sizes. The substrate may be produced by various methods including extruding, injection molding, machining or other methods known to the art. The polyimide material useful with this invention may be any of a group of high polymers which have an imide group (—CONHCO—) in the polymer chain. Polyimides are manufactured through a variety of methods with those formed by reacting bis-phenol A dianhydrides with phenylene diamine producing a group referred to as polyetherimides. The preferred polyimides for the present invention are those commonly referred to as "polyetherimides" for example, the General Electric Ultem brand plastic. The polyimides may contain various amounts of fillers or reinforcing agents which are well known in the art. These fillers may include glass, silica, mica, mineral glass and others. The amount of fillers present helps to further classify the polyimide resins into various grades. The process is also applicable to resins which may contain other components including antistatic agents, pigments, plasticizers, antioxidants and other similar functional additives.

The conditioner used in the pretreatment step prior to etching is a lactone. The use of a lactone as a conditioner represents an improvement over prior art since it provides greater potential for through-put of articles, has less tendency to be hydroscopic, and is more easily waste-treatable than other conventional solvents used. The preferred lactone for use with polyimide substrates is gamma-butyrolactone. This lactone was specifically selected because it is less aggressive with the recommended substrates and for the selective chemistry between the lactone and the substrate. It promotes adhesion without unduly weakening or adversely affecting the physical characteristics of the resin. Gamma-butyrolactone softens the surface of the resin enough to allow the subsequent etchant to create a microporous surface suitable for initial metallization with minimal degradation of the substrate which insures cohesive integrity of the substrate during functional testing. The degree of softening and depth of chemical attack is controlled for the selected substrate in order to provide optimal adhesion values in the range of 8–16 lbs./linear inch. Control of the amount of softening and the depth of penetration is achieved by selecting the time, temperature and concentration of the lactone. The concentration of the lactone in the conditioner depends on the particular resinous substrate used, and is typically in the range of 50–100%, but is preferably used in a more concentrated state (85–100%). The temperature of the solution during immersion of the substrate may range from about 24° F. to about 65° F. The time of immersion again depends on the particular substrate and may range from 1–10 minutes, but is preferably 1–5 minutes.

An important step in the operation of the invention is the use of a water rinse immediately after conditioning. The temperature of the water may be chilled or room temperature but is preferably in the range of 38° F.–100° F. This step insures that the pores of the substrate remain open while effectively rinsing the conditioner from the substrate. This allows the next step of oxidative etching to create the desired micro-porous surface.

Subsequent steps prior to electroless metal deposition may include chromic acid or permanganate etching as described in U.S. Pat. Nos. 3,668,130 and 4,515,829, incorporated herein by reference. Neutralization prior to electroless metal deposition is also accomplished by methods well known to the art.

While there are many prior art processes for electroless metal deposition, a preferred process comprises the application of copper by a tin-palladium catalysis technique in which the surfaces on which the copper is to be deposited are activated and sensitized in order to catalyze the chemical surface reduction. This process is described in U.S. Pat. No. 3,011,920, incorporated herein by reference.

Following electroless plating, the substrate may be electrolytically plated by conventional means with copper, nickel, gold, silver, solder, chromium and the like to achieve the desired finish or thickness.

The following specific examples provide novel embodiments of the present invention. They are intended for illustrative purposes only and should not be construed as a limitation upon the broadest aspects of the invention. The examples illustrate various process steps used in operation with the disclosed invention and the results of adhesion testing done by IPC Test Methods 2.4.8 and/or 2.4.9.

The following descriptions of solutions or baths used in the examples should not be taken as limitations to the practice of the invention but as representative of solutions or baths typically used in the industry.

Chrome Etch 940 used is a solution of hexavalent chrome, sulfuric acid and water. Permanganate Etch MLB 213 is an alkaline permanganate solution. The Neutralizer PM 954 solution is a typical sulfate reducing solution. Catalyst Pre-Dip 404 contains hydrochloric acid and sodium chloride. Cataposit 44 is a typical tin-palladium catalyst. Accelerator 241 is an activating solution which contains a sulfonic acid. Electroless Copper Strike PM 994 is an auto-catalytic copper sulfate solution. Full Build Electrodeposit 272 solution is a standard acid copper formulation used for plating.

EXAMPLES

Examples 1-5 show the results of the pretreatment process of conditioning followed by a hot water rinse. Adhesion values obtained with this process are typically 8-16 lbs./linear inch depending upon the grade of substrate used. Example 6 shows the result of no pretreatment and values are typically 1-3 lbs./linear inch. Improvements in adhesion are found with the use of cold water or room temperature water rinses following pre-treatment with the conditioner as shown in Examples 7 and 8. The values for adhesion show a slight improvement over the practice of the invention without the conditioner. Values obtained with these water rinses are usually 4-6 lbs./linear inch, respectively.

EXAMPLE 1

Substrate—General Electric Ultem 2312
(polyetherimide resin/glass filler)

| Process Sequence | Immersion Time (min) | Temp °C. |
|---|---|---|
| 1. Butyrolactone (98-100%) | 6 | 49 |
| 2. Hot Water Rinse | 5 | 49 |
| 3. Chrome Etch PM 940 | 6 | 71 |
| 4. Rinse | 5 | RT |
| 5. Neutralizer PM 954 | 6 | 65 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |

Results: 13 lbs./linear inch peel strength

EXAMPLE 2

Substrate — General Electric Ultem 3812
(polyetherimide resin/mineral/glass filler)

| Process Sequence | Immersion Time (min) | Temp °C. |
|---|---|---|
| 1. Butyrolactone (98-100%) | 7 | 49 |
| 2. Hot Water Rinse | 5 | 49 |
| 3. Chrome Etch PM 940 | 10 | 71 |
| 4. Rinse | 5 | RT |
| 5. Neutralizer PM 954 | 5 | 65 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |

Results: 14 lbs./linear inch peel strength

EXAMPLE 3

Substrate—General Electric Ultem 2312
(polyetherimide resin/glass filler)

| Process Sequence | Immersion Time (min) | Temp °C. |
|---|---|---|
| 1. Butyrolactone (98-100%) | 6 | 71 |
| 2. Hot Water Rinse | 5 | 49 |
| 3. Permanganate Etch MLB 213 | 15 | 71 |
| 4. Hot Rinse | 2 | 49 |
| 5. Neutralizer PM 954 | 7 | 49 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |

Results: 8 lbs./linear inch peel strength

EXAMPLE 4

Substrate—LNP Engineering Plastics EM 3240
(polyetherimide resin/glass filler)

| Process Sequence | Immersion Time (min) | Temp °C. |
|---|---|---|
| 1. Butyrolactone (98-100%) | 8 | 49 |
| 2. Hot Water Rinse | 5 | 49 |
| 3. Permanganate Etch MLB 213 | 18 | 71 |
| 4. Rinse | 2 | RT |
| 5. Neutralizer PM 954 | 7 | 49 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |

Results: 11 lbs./linear inch peel strength

EXAMPLE 5

Substrate—LNP Engineering Plastics EF 1004
(polyetherimide resin/glass filler)

| Process Sequence | Immersion Time (min) | Temp °C. |
|---|---|---|
| 1. Butyrolactone (98–100%) | 8 | 49 |
| 2. Hot Water Rinse | 5 | 49 |
| 3. Chrome Etch PM 940 | 8 | 71 |
| 4. Rinse | 5 | RT |
| 5. Neutralizer PM 954 | 6 | 49 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |
| Results: 10 lbs./linear inch peel strength | | |

EXAMPLE 6

Substrate—General Electric Ultem 2312
(polyetherimide resin/glass filler)

| Process Sequence | Immersion Time (min) | Temp °C. |
|---|---|---|
| 1. No Conditioner used | | |
| 2. No Rinse Step | | |
| 3. Chrome Etch PM 940 | 6 | 71 |
| 4. Rinse | 5 | RT |
| 5. Neutralizer PM 954 | 6 | 65 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |
| Results: 3 lbs./linear inch peel strength | | |

EXAMPLE 7

Substrate—General Electric Ultem 2312
(polyetherimide resin/glass filler)

| Process Sequence | Immersion Time (min) | Temp °C. |
|---|---|---|
| 1. Butyrolactone (98–100%) | 6 | 49 |
| 2. Room Temperature Water Rinse | 5 | RT |
| 3. Chrome Etch PM 940 | 6 | 71 |
| 4. Rinse | 5 | RT |
| 5. Neutralizer PM 954 | 6 | 65 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |
| Results: 6 lbs./linear inch peel strength | | |

EXAMPLE 8

Substrate—General Electric Ultem 2312
(polyetherimide resin/glass filler)

| Process Sequence | Immersion Time (min) | Temp °C. |
|---|---|---|
| 1. Butyrolactone (98–100%) | 6 | 49 |
| 2. Cold Water Rinse | 5 | 15 |
| 3. Chrome Etch PM 940 | 6 | 71 |
| 4. Rinse | 5 | RT |
| 5. Neutralizer PM 954 | 6 | 65 |
| 6. Rinse | 5 | RT |
| 7. Catalyst Pre-Dip 404 | 1 | RT |
| 8. Cataposit 44 | 6 | 43 |
| 9. Rinse | 3 | RT |
| 10. Accelerator 241 | 2 | RT |
| 11. Rinse | 3 | RT |
| 12. Electroless Copper Strike PM 994 | 15 | 43 |
| 13. Full Build Electrodeposit 272 | 45 | RT |
| 14. Rinse | 5 | RT |
| 15. Bake | 3 hrs. | 121 |
| Results: 4 lbs./linear inch peel strength | | |

What is claimed is:

1. A pretreatment process for improved adhesion between a filled polyetherimide substrate and an electrolessly deposited metal thereon, said pretreatment process comprising steps of contacting said substrate with gamma-butyrolactone, followed by an aqueous rinse prior to the subsequent step of electrolessly depositing said metal.

2. The process of claim 1 wherein said filled polyetherimide contains a filler selected from the group including silica, glass, mica, mineral glass and others.

3. The process of claim 1 wherein said filled polyetherimide contains other components selected from the group consisting of antistatic agents, pigments, plasticizers, antioxidants and other similar functional additives.

4. The process of claim 1 wherein the temperature of said gamma-butyrolactone is in the range of 24° C. to 65° C.

5. The process of claim 1 wherein the temperature of said gamma-butyrolactone is 49° C.

6. The process of claim 1 wherein the concentration of said gamma-butyrolactone is 50–100% (v/v).

7. The process of claim 1 wherein the concentration of said gamma-butyrolactone is 85–100% (v/v).

8. The process of claim 1 wherein the temperature of said water rinse is at least 38° C.

9. The process of claim 1 wherein the temperature of said water rinse is 49° C.

10. The process of claim 1 wherein said subsequent steps of electrolessly depositing metal includes the step of etching by chromic acid.

11. The process of claim 1 wherein said subsequent steps of electrolessly depositing metal includes the step of etching by alkaline permanganate.

12. The process of claim 1 wherein said metal is copper, nickel or a combination thereof.

13. An article of manufacture by the process of claim 1.

* * * * *